US010390428B2

(12) United States Patent
Wu et al.

(10) Patent No.: US 10,390,428 B2
(45) Date of Patent: Aug. 20, 2019

(54) ELECTRICAL CONNECTION STRUCTURE

(71) Applicant: Far Eastern New Century Corporation, Taipei (TW)

(72) Inventors: Yu-Chun Wu, Taipei (TW); Wei-Che Hung, Taipei (TW); Hsin-Kai Lai, Taipei (TW)

(73) Assignee: Far Eastern New Century Corporation, Taipei (TW)

( * ) Notice: Subject to any disclaimer, the term of this patent is extended or adjusted under 35 U.S.C. 154(b) by 0 days.

(21) Appl. No.: 16/141,984

(22) Filed: Sep. 26, 2018

(65) Prior Publication Data

US 2019/0223288 A1 Jul. 18, 2019

(30) Foreign Application Priority Data

Jan. 18, 2018 (TW) .............................. 107101882 A

(51) Int. Cl.
| | |
|---|---|
| *H05K 1/00* | (2006.01) |
| *H05K 1/02* | (2006.01) |
| *H05K 1/03* | (2006.01) |
| *H05K 1/09* | (2006.01) |
| *H05K 1/11* | (2006.01) |
| *A41D 1/00* | (2018.01) |
| *H01B 1/22* | (2006.01) |
| *H05K 3/32* | (2006.01) |
| *B32B 27/08* | (2006.01) |

(Continued)

(52) U.S. Cl.
CPC .............. *H05K 1/038* (2013.01); *A41D 1/002* (2013.01); *B32B 7/10* (2013.01); *B32B 7/12* (2013.01); *B32B 27/08* (2013.01); *H01B 1/22* (2013.01); *H05K 1/0283* (2013.01); *H05K 3/321* (2013.01)

(58) Field of Classification Search
CPC .. H05K 1/00; H05K 1/02; H05K 1/03; H05K 1/09; H05K 1/11; H01L 21/00; H01L 21/02; H01L 21/20; H01L 23/00; H01L 23/48
USPC ....... 174/250, 254, 255, 257, 259, 260, 261; 361/750, 804; 257/69, 688
See application file for complete search history.

(56) References Cited

U.S. PATENT DOCUMENTS

2004/0195569 A1* 10/2004 Hashimoto ......... H01L 27/1214
  257/69
2004/0245619 A1* 12/2004 Takeuchi .......... H01L 23/49827
  257/688

(Continued)

FOREIGN PATENT DOCUMENTS

| TW | M523718 U | 6/2016 |
| TW | 201703723 A | 2/2017 |
| TW | M540743 U | 5/2017 |

*Primary Examiner* — Xiaoliang Chen
(74) *Attorney, Agent, or Firm* — Winston Hsu

(57) ABSTRACT

An electrical connection structure is provided in the present invention, which includes a substrate, a plurality of conductive textile layers disposed apart on the substrate, an electrical connection layer disposed on the conductive textile layers, a plurality conductive parts disposed on the electrical connection layer corresponding to the conductive textile layers respectively, an adhesive layer, and a protective layer, wherein the electrical connection layer provides the electrical connection between the conductive textile layers and the conductive parts corresponding to the conductive textile layers, and the conductive textile layers disposed apart from each other are not electrically connected.

16 Claims, 3 Drawing Sheets

(51) Int. Cl.
*B32B 7/12* (2006.01)
*B32B 7/10* (2006.01)

(56) References Cited

U.S. PATENT DOCUMENTS

| | | | |
|---|---|---|---|
| 2008/0169349 A1* | 7/2008 | Suzuki | H01L 21/84 235/492 |
| 2012/0026700 A1* | 2/2012 | Furuta | H05K 3/361 361/750 |
| 2017/0027473 A1 | 2/2017 | Lai | |

* cited by examiner

ELECTRICAL CONNECTION STRUCTURE

BACKGROUND OF THE INVENTION

1. Field of the Invention

The present invention relates generally to an electrical connection structure, and more particularly to an electrical connection structure which is suitable for use in a wearable smart device and is laundering-resistant.

2. Description of the Prior Art

In recent years, owing to the changes of people's exercise habits and the greatly increased needs for self-management (self-care), quite a few manufacturers have researched and developed a wearable smart device for instantly monitoring the real-time physiological information.

In the beginning, inmost wearable smart devices the integrated circuits and the sensing elements are assembled and connected together through an electrical connection structure to form a single electronic module, and main applications are for use in a smart watch, a smart wristband, or a smart band. However, bounded by its applications to be worn, the detection of this type of wearable device is directed to a specific part of the body only, and fails to obtain overall physiological sensing information. In the sensing mode, if these devices are unable to be inclose contact with the skin, the detected results which are captured by the smart device are also resultantly affected.

Subsequently, the development of clothing based wearable smart devices is gradually emphasized because clothing is stretchable, flexible and able to be in close contact with the skin. If the integrated circuits, the electrical connection structure and the sensing elements are simply embedded in the clothing, the rigidity of this kind of electronic module will cause obvious foreign body sensation while wearing and make the clothing unwashable. Then, in order to improve the washability, it was proposed that the rigid electronic module was first arranged on a webbing or a fabric substrate then combined with the clothing to be worn with the help of a buckle, a zipper or a lanyard. In case of laundering, the electronic module can be detached from the clothing. For example, U.S. Patent Publication No. 20020084901 proposes a smart clothing which is integrated with an electronic module by a fastening device such as a button or a zipper. However, the electronic module needs to be repeatedly disassembled before laundry, and it is inconvenient to use. Owing to the rigidity of button and zipper and the significant total weight, smart clothing is less comfortable to wear.

Afterwards, in order to solve the rigidity problem of the electronic module, a technique has been developed by weaving conductive fibers to form conductive threads, and further to form a conductive fabric. It can replace the conventional electronic circuit elements to use as an electrical connection structure because of the conductivity of conductive fabric (for example, the disclosure of U.S. Patent Publication 2011073353. Moreover, a conductive fabric is more stretchable than a simple metal electronic circuit is, and it can be applied widely to obtain the physiological information at the joint. However, its surface is prone to wear or even break so the surface resistance value increases after being subjected to laundry many times so that the conductive fibers are unable to maintain a stable electric conductivity and fail to function normally.

In addition, some developers try to connect the sensing element and a remote signal processing module by wireless transmission to replace the conventional wired connection structure and to solve the problem that the electronic module is unwashable. However, as the current technology level is concerned, it is subject to time lag when the information is integrated while the sensing element is transmitting the physiological information back to the signal processing module through the wireless connection. When continuous and various pieces of information transmitted by the sensing element are needed processing, it is prone to data processing errors.

Therefore, in the technical field it is an important issue to research and to propose a wired electrical connection structure which is suitable for use in a wearable smart device and laundering-resistant to improve the above-mentioned drawbacks in prior art.

SUMMARY OF THE INVENTION

Accordingly, the main object of the present invention is to provide an electrical connection structure which is applicable to the electrical connection between elements in a wearable smart device and has effectively improved washability in order to solve the problems of prior art.

Another object of the present invention is to provide a sensing device which includes the above-mentioned electrical connection structure to be applicable to a smart device for composite information sensing.

Another object of the present invention is to provide a transcutaneous electrical nerve stimulation device which includes the above-mentioned electrical connection structure and can be easily and quickly mass-produced.

To achieve the above-mentioned objectives, the present invention provides an electrical connection structure which includes a substrate, a plurality of conductive textile layers, an electrical connection layer, a plurality of conductive parts, an adhesive layer and a protective layer. The conductive textile layers are separately disposed apart from each other on the substrate. The conductive parts are disposed on the electrical connection layer and correspond to the conductive textile layers. The electrical connection layer provides the electrical connection between the conductive textile layers and the conductive parts corresponding to the conductive textile layers, and the conductive textile layers which are separately disposed apart from each other are not directly electrically connected.

The electrical connection structure of the present invention has features such as light-weight, thin, and soft. It makes users feel more comfortable when applied to clothing. According to the AATCC135 method, its electrical properties maintain well after being repeatedly laundered more than 25 times so it solves the problem of the conventional smart fabrics which is unwashable.

In addition, the electrical connection structure of the present invention is easy to be manufactured to meet the demands of fast and mass production. It can simultaneously perform a plurality of sets wiring or fixing on the same plane of conductive textile layers for use in sensing to improve the problem of individual wiring of each sensor which results in more labor hours and more cost in prior art. So, it is applicable to the smart device of composite information sensing.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
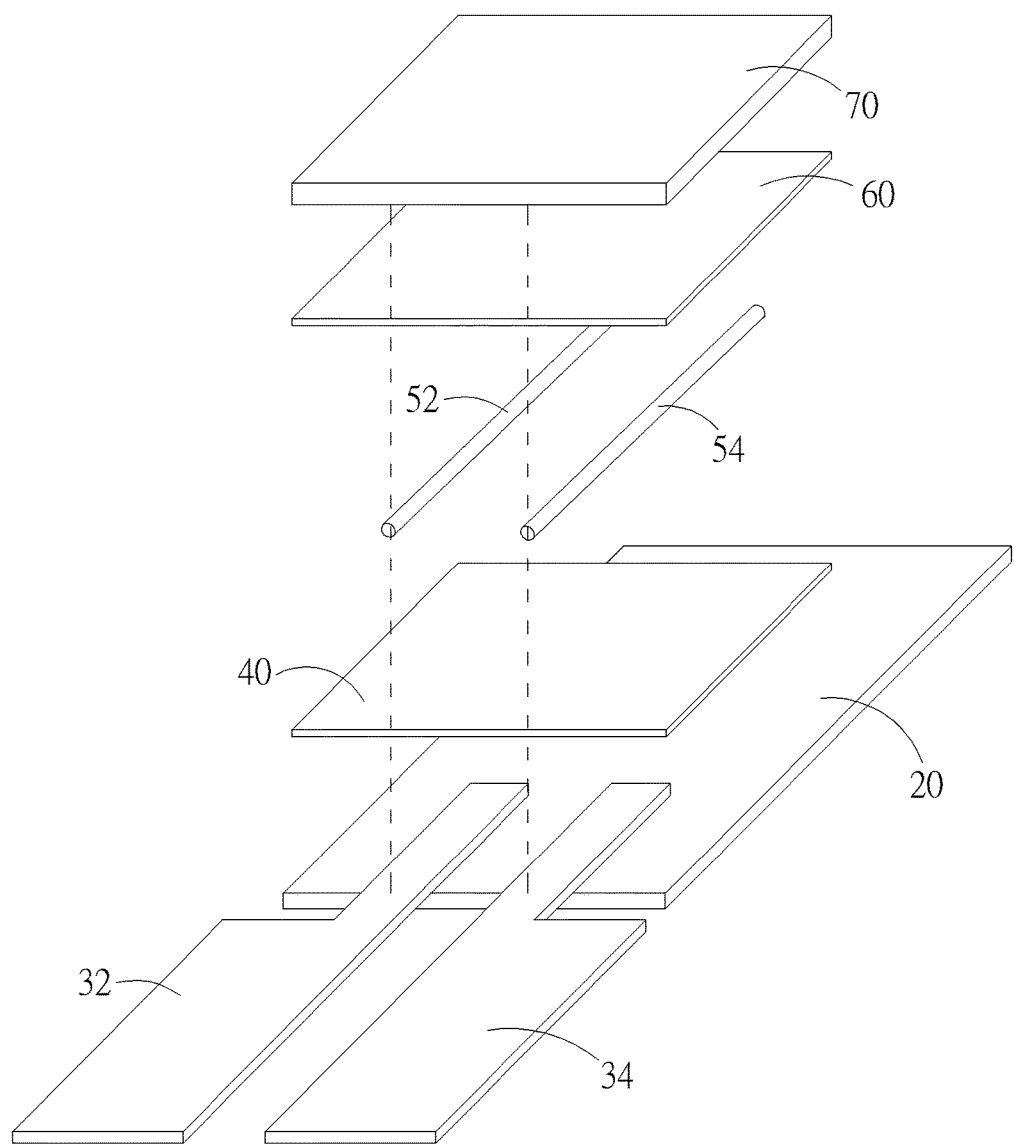
FIG. 1A is a perspective exploded view and a perspective schematic view of an embodiment of the electrical connection structure of the present invention.

Before the present invention is described in detail, it is to be noted that in the following description, similar elements are denoted by the same reference numerals.

To make those skilled in the art more easily understand the present invention through the description of the present specification, the following is further described in conjunction with the drawings. It will be understood by those skilled in the art that the following description is only to illustrate the techniques of the present invention and describe the preferred scope of implementation conditions and is not intended to limit the scope of the present invention.

Figure 1B:
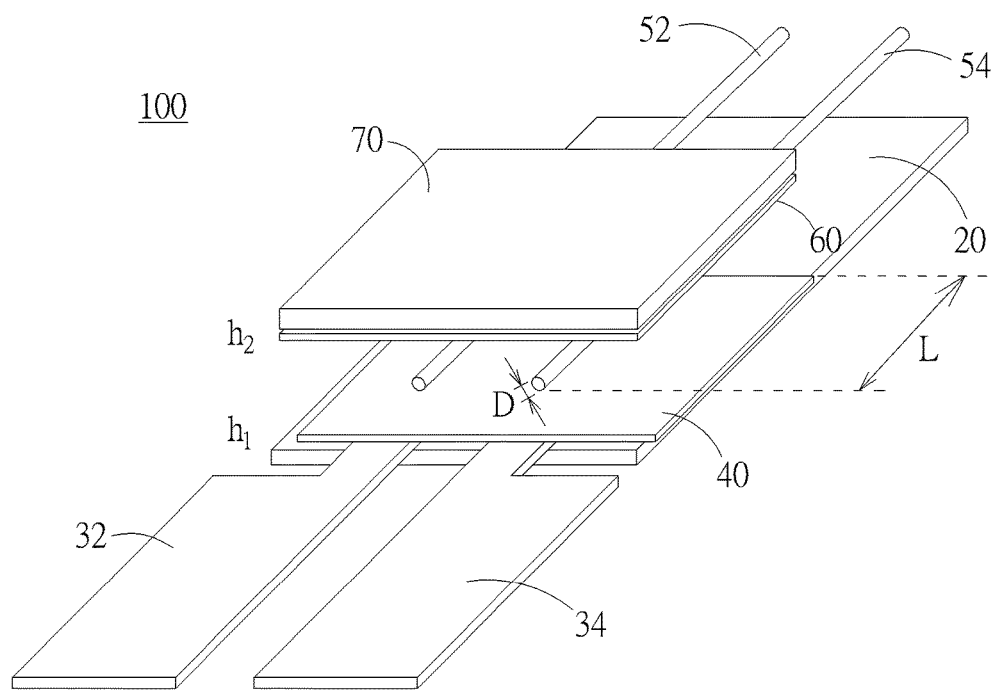
FIG. 1B is a perspective schematic view of an embodiment of the electrical connection structure of the present invention.

For a detailed description of the electrical connection structure 100 of the present invention, please refer to FIG. 1A and FIG. 1B. FIG. 1A and FIG. 1B are respectively a perspective exploded view and a perspective schematic view of an embodiment. The electrical connection structure 100 of the present invention includes a substrate 20, a plurality of conductive textile layers 32, 34 which are separately disposed apart from each other on the substrate 20, an electrical connection layer 40, a plurality of conductive parts 52, 54, an adhesion layer 60 and a protective layer 70.

The above-mentioned conductive textile layers 32, 34 do not contact each other directly.

The above-mentioned electrical connection layer 40 is disposed on the conductive textile layers 32, 34. The above-mentioned conductive parts 52, 54 are disposed on the electrical connection layer 40 and respectively correspond to the conductive textile layers 32, 34, and the conductive parts 52, 54 substantially are not indirect contact with the conductive textile layers 32, 34.

The quantity of the above-mentioned conductive parts 52, 54 substantially equals to the quantity of the conductive textile layers 32, 34.

The above-mentioned conductive parts 52, 54 are also separately disposed apart from each other without contacting each other directly.

The above-mentioned electrical connection layer 40 provides the electrical connection between the conductive textile layers 32, 34 and the conductive parts 52, 54 which respectively correspond to the conductive textile layers 32, 34, and there is no electrical connection between the conductive textile layer 32 and the conductive textile layer 34 which are separately disposed apart from each other.

The above-mentioned adhesive layer 60 is disposed on the conductive parts 52, 54. The adhesive layer 60 is used to fix the conductive parts 52, 54 so that the conductive parts 52, 54 can be fixed between the adhesive layer 60 and the electrical connection layer 40 to enhance the structural strength of the electrical connection structure 100.

The above-mentioned protective layer 70 is disposed on the adhesive layer 60. The protective layer 70 is used to further increase the structural strength of the electrical connection structure 100 and to make it more washable and wear-resistant.

Figure 1C:
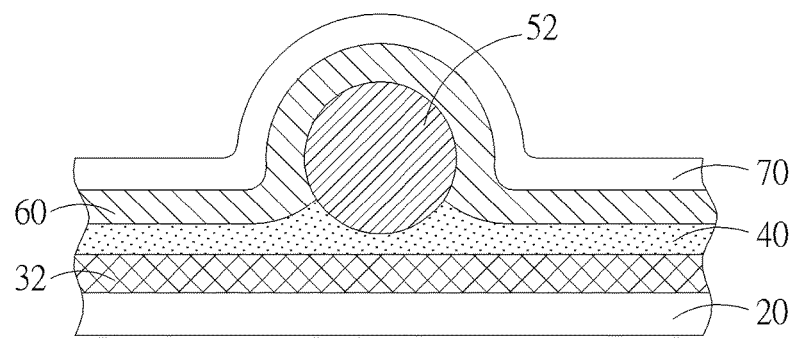
FIG. 1C is a partial cross-sectional perspective view of an embodiment of the electrical connection structure of the present invention.

Please refer to FIG. 1C. FIG. 1C is a partial cross-sectional view of an embodiment of the electrical connection structure 100. FIG. 1C illustrates the relative positions amongst elements such as a single conductive part 52, an electrical connection layer 40 and an adhesive layer 60. The conductive part 52 is disposed between the electrical connection layer 40 and the adhesive layer 60. The electrical connection layer 40 and the adhesive layer 60 respectively have a certain thickness to keep sufficient strength to maintain the conductive part 52 well fixed in the electrical connection structure 100. Therefore, the thickness $h_1$ of the electrical connection layer 40 is preferably not less than 30 μm. The thickness $h_2$ of the adhesive layer 60 is preferably not less than 30 μm.

Accordingly, the sum of the thickness $h_1$ of the electrical connection layer 40 and the thickness $h_2$ of the adhesive layer 60 is preferably not less than 60 μm in total so that the conductive part 52 is less likely to come loose easily. More preferably, the sum of the thickness $h_1$ of the electrical connection layer 40 and the thickness $h_2$ of the adhesive layer 60 is not less than 70 μm in total. In addition, when the electrical connection structure 100 is applied to wearable smart devices, demands such as comfort and flexibility must be met and considered so the overall thickness should not be too much. In the light of these, the sum of the thickness $h_1$ of the electrical connection layer 40 and the thickness $h_2$ of the adhesive layer 60 is preferably not greater than 300 μm in total. More preferably, the sum of the thickness $h_1$ of the electrical connection layer 40 and the thickness $h_2$ of the adhesive layer 60 is not greater than 150 μm in total.

Further, the greater the sum of the first contact area between the conductive part 52 and the electrical connection layer 40 and the second contact area between the conductive part 52 and the adhesive layer 60 is the better the cladding effect is to cover the conductive part 52 by the electrical connection layer 40 and by the adhesive layer 60. It greatly makes the conductive part 52 less likely come loose as well to effectively improve the washability.

Taking a cylindrical conductive part 52 as an example, the sum A of the first contact area between the conductive part 52 and the electrical connection layer 40 and the second contact area between the conductive part 52 and the adhesive layer 60 is:

$$A = \pi \times D \times L$$

where D is a radial length of the conductive part, and L is the length of the portion of the conductive part which is in contact with both the electrical connection layer 40 and the adhesive layer 60 at the same time.

Preferably, when at least the sum of the first contact area between the conductive part 52 and the electrical connection layer 40 and the second contact area between the conductive part 52 and the adhesive layer 60 is not less than 15.7 mm², the electrical connection structure 100 of the present invention exhibits good performance of washability.

The substrate 20 applicable in the instant disclosure is not particularly limited and may be selected from bands, clothes, textiles, or films with adhesive functions (for example hot melt adhesive film) in consideration of functionality, wearing convenience, aesthetic design, and the like. That is, the electrical connection structure 100 may be directly disposed on the textiles being worn, or alternatively may be first disposed on a film material, then attached (for example glued or stitched) to the textile to be applied. Preferably, the substrate 20 maybe a band or a textile, in particular, a band which can be fixed to an arm or to a leg, or a textile which has a protective effect, such as a wrist guard, an elbow guard so that a wrist guard or an elbow guard may have the functions of detecting pulses and myoelectricity at the same time.

The conductive textile layer 32 basically includes a fabric substrate and a conductive coating layer made of a hydrophobic adhesive and a plurality of conductive particles distributed therein. The conductive coating layer is embedded in the fabric substrate from one side of the fabric substrate and leveled with the fabric substrate, and the thickness of the conductive coating layer is not greater than the thickness of the textile substrate. Please refer to the descriptions of Taiwanese Patent I581758 for the selection of materials and detailed preparation methods of the conductive textile layer 32, and all the contents disclosed in this patent are incorporated by reference in the present invention and within the scope of the specification of the present invention.

In an embodiment of the present invention, the structures and manufacturing processes of conductive textile layer 34 or other not shown conductive textile layers are substantially the same as those of the conductive textile layer 32, and one of ordinary skill in the art may modify them in accordance with the demands and convenience in terms of designs or in terms of manufactures.

In the electrical connection structure 100 of the present invention, one side with the conductive coating layer of the conductive textile layers 32, 34 is in contact with the electrical connection layer 40 so that the electrical current signals may be transmitted smoothly.

The electrical connection layer 40 according to the present invention is composed of an anisotropic conductive adhesive.

The above-mentioned anisotropic conductive adhesive includes a thermosetting resin and conductive particles dispersed therein.

The thermosetting resin which may be applicable in the electrical connection layer 40 of the present invention is not particularly limited. A thermosetting resin is applicable as long as it has good heat resistance and good electrical insulation. It may be selected from a group consisting of at least one of an epoxy resin, a melamine formaldehyde resin, a polybutadiene resin and an organic silicone resin. Preferably, the thermosetting resin is an epoxy resin.

The above-mentioned epoxy resin is a liquid epoxy resin, such as a bisphenol-A epoxy resin, a bisphenol-F epoxy resin, a phenolic epoxy resin, o-cresol novolac epoxy resin, a flexibilized epoxy resin or any combination thereof but not limited thereto.

The conductive particles applicable to the electrical connection layer 40 of the present invention are metal particles, alloy particles or metal-plated polymer resin particles. Preferably, the conductive particles are polymer resin particles which are plated with metal on the surface. There is a nickel layer which is coated on the resin particles and gold is plated on the surface of the nickel layer.

The range of the particle size distribution of the conductive particles in the above-mentioned electrical connection layer 40 is preferably 4 µm-10 µm. More preferably, the particle size distribution of the conductive particles is in a range of 4 µm-8 µm.

The range of the density distribution of the conductive particles in the above-mentioned electrical connection layer 40 is preferably 800 pcs/mm$^2$-8000 pcs/mm$^2$. More preferably, the range of the density distribution of the conductive particles is 1000 pcs/mm$^2$-2000 pcs/mm$^2$.

It is conventionally known that the features of an anisotropic conductive adhesive may have a conductive state in the vertical direction and have non-conductive state in the horizontal direction. This is because the conductive particles move towards the direction of the applied pressure when the anisotropic conductive adhesive is subjected to an external vertical pressure. The conductive particles contact one another or are deformed due to squeeze so the applied pressure in the vertical direction facilitates a conductive state. The conductive particles along the horizontal direction are not brought into contact with one another to make the conductive state possible because the conductive particles along the horizontal direction without applied pressure are still segregated from one another by the thermosetting resin.

Therefore, when applied to the electrical connection structure 100, taking an electric current signal entering the conductive textile layer 32 as an example, the electric current signal is transmitted through the electrical connection layer 40 to the conductive part 52 and is further output. The electric current signal is neither directly transmitted to a non-corresponding conductive part (such as the conductive part 54) through the horizontal direction of the electrical connection layer 40, nor directly transmitted to other conductive textile layer (such as the conductive textile layer 34) through the electrical connection layer 40.

The above-mentioned anisotropic conductive adhesive which constitutes the electrical connection layer 40 is sticky and has a certain degree of fluidity before it is completely cured so it may have better coverage and adhesion with the conductive parts 52, 54. Also, there are more contact areas between the conductive parts 52, 54 and the electrical connection layer 40 due to the fluidity of the anisotropic conductive adhesive, the conductive parts 52, 54 are thus less likely to come loose from the electrical connection layer 40 so that the electric current signals may be transmitted in a more steady way.

The conductive parts 52, 54 described in the present invention are not particularly limited and may include, but are not limited to, electric conductive wires or electric conductive sheets.

For the convenience of operation, each of the above-mentioned conductive parts 52, 54 may respectively be composed of at least one electric conductive wire. Preferably, the electric conductive wire is a metal wire.

The metal wire applicable in the present invention is not particularly limited. It may include, but is not limited to, a copper wire, a silver wire, a gold wire, or a stainless steel wire. When it comes to the characteristics such as lower cost and not easily damaged or the like, the metal wire is preferably a copper wire.

The shape of the metal wire applicable in the present invention is not particularly limited, and may be a cylindrical shape, a cuboid shape, or a hexagonal prism shape. Preferably, the metal wire is in a cylindrical shape.

The radial length D of the metal wire applicable to the present invention (or the length of two farthest ends of the cross-section) is not particularly limited. Taking the evenness and the overall dimensions of the electrical connection structure 100 as a whole into consideration, the radial length D is preferably not greater than 0.7 mm. In order to meet the requirement of the resistance of the metal wire in the present invention less than 100 Ω/M, the radial length D is preferably not less than 0.5 mm.

The material of the adhesive layer 60 is a thermosetting resin or a photocurable resin. The above-mentioned thermosetting resin may be an epoxy resin, a melamine formaldehyde resin, a polybutadiene resin, an organic silicone resin, or any combination thereof, but is not limited thereto. The above-mentioned photocurable resin may be an acrylic resin, a urethane acrylate, or any combination thereof, but is not limited thereto. For the convenience and continuity of the process, the material for the adhesive layer 60 is preferably a thermosetting resin.

The above-mentioned adhesive layer 60 of the present invention is an anisotropic conductive adhesive containing a thermosetting resin.

The material of the protective layer 70 applicable to the present invention is not particularly limited, as long as it can protect the electrical connection structure 100 from deformation or scratches. It may be selected from a polyurethane resin, a thermoplastic polyurethane resin, polyethylene, polyethylene terephthalate, or any combination thereof, but is not limited thereto. For the convenience of operation, the protective layer 70 is preferably a polyurethane resin, a thermoplastic polyurethane resin, or any combination thereof.

The method for providing the conductive textile layers 32, 34 on the substrate 20 is not particularly limited in the present invention. For example, an adhesive may be applied to the substrate 20 and covered with the conductive textile layers 32, 34 to be fixed. Alternatively, a sheet-type adhesive film may be used to cover the substrate 20, then the conductive textile layer 32,34 are covered and fixed after a release paper is peeled off. Or, the conductive textile layers 32, 34 may also be directly attached (for example, sewed together) to a fabric or to a textile to be worn as the substrate 20.

The arrangement of the positions of the conductive textile layers 32, 34 which are separately disposed apart from each other on the substrate 20 may be adjusted according to various demands. For example, for the convenience of process, they may be arranged in a predetermined pattern.

The sizes and shapes of the conductive textile layers 32, 34 can be adjusted in accordance with the demands for design without particular limitations.

The approaches to provide the electrical connection layer 40 are not particularly limited in the present invention. For the convenience and continuity of the process, techniques such as gravure printing, screen printing, relief printing, dispensing and slot coating can be directly used on the conductive textile layers 32, 34. Alternatively, electrical connection layer 40 maybe first applied on a release paper then transferred onto the conductive textile layers 32, 34 and afterwards the release paper is peeled off, but the techniques are not limited thereto.

The approaches to provide the conductive parts 52, 54 are not particularly limited in the present invention. The conductive parts 52, 54 may be directly placed on the electrical connection layer 40 and later fixed with the adhesive layer 60. The conductive parts 52, 54 may also be disposed on the electrical connection layer 40 by the techniques such as printing or etching in accordance with the needs of the electric circuit design, for example, a copper foil etched as a predetermined circuit pattern.

The approaches to provide the adhesive layer 60 are not particularly limited in the present invention. For the convenience and continuity of the process, techniques such as gravure printing, screen printing, relief printing, dispensing and slot coating may be used. Alternatively, the adhesive layer 60 may be first applied on a release paper then transferred onto the conductive parts 52, 54 and afterwards the release paper is peeled off, but the techniques are not limited thereto.

The approaches to provide the protective layer 70 are not particularly limited in the present invention. For the convenience and continuity of the process, techniques such as gravure printing, screen printing, relief printing, dispensing and slot coating may be used, but not limited thereto.

Figure 2:
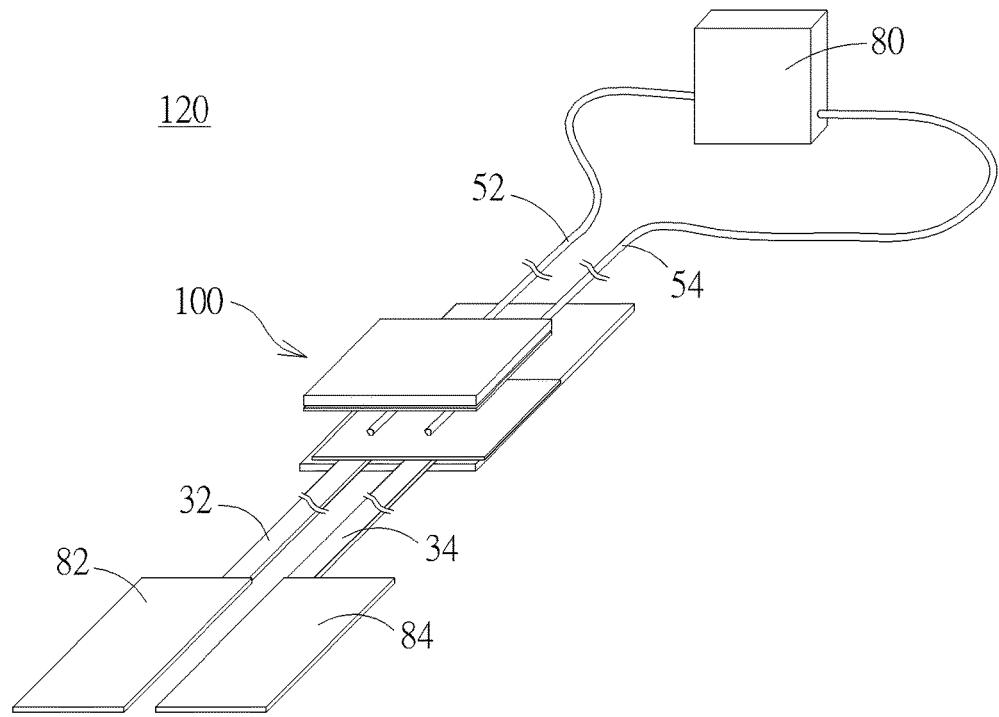
FIG. 2 is a schematic perspective view of an embodiment of a sensing device of the present invention.

Please refer to FIG. 2. FIG. 2 is a schematic perspective view of an embodiment of a sensing device 120 of the present invention. The sensing device 120 includes an electrical connection structure 100, a plurality of sensing elements 82, 84, and a signal processing module 80.

The above-mentioned sensing elements 82, 84 respectively correspond to and are directly electrically connected to the conductive textile layers 32, 34 in the electrical connection structure 100.In addition, the positive terminal and negative terminal of the above-mentioned signal processing module 80 respectively correspond to and are directly electrically connected to the conductive parts 52, 54 in the electrical connection structure 100.

In the sensing device 120 of the present invention, the conductive textile layers 32, 34 which are connected to the sensing elements 82, 84 are used to serve as circuits for electrical connection so that the electric current signals can be smoothly transmitted through the connection structure 100.The above-mentioned sensing elements 82, 84 in the present invention are not particularly limited. Any conventional or unknown sensing element is applicable to the present invention as long as it is able to sense the needed physiological information. For example, the materials and manufacturing methods for the sensing element 82 maybe substantially the same as those of the conductive textile layer 32 so the sensing element 82 and the conductive textile layer 32 may be accordingly prepared and completed at the same time. Therefore, in this embodiment, an extension end of the sensing element 82 is used to serve as the conductive textile layer 32 and arranged within the electrical connection structure 100.

The sizes or shapes of the sensing elements 82, 84 are not particularly limited, and may be adjusted according to the demands such as the overall structure design or increasing the sensitivity.

The above-mentioned signal processing module 80 is not particularly limited. Any conventional or unknown signal processing module may be applicable to the present invention. For example, it may include a storage element for the storage of the received physiological information from the sensing elements.

In addition, the above-mentioned signal processing module 80 may further include a transmitting element depending on the application requirements to transmit the physiology information which has been processed by the signal processing module 80 in a wireless way to a processor for computation and analysis.

The above-mentioned sensed or processed physiological information may include, for example, a heart rate, a respiratory rate, the blood pressure, the pulse, the number of activity steps, the activity frequency, the body temperature or the humidity, and the like. In addition, the sensing device 120 may sense and process various physiological information at the same time. Therefore, the number of the sensing elements and the number of the conductive textile layers and the conductive parts in the electrical connection structure 100 are not particularly limited, and may be optionally arranged to meet demands. Preferably, the sensing elements are arranged in pairs.

When the sensing device 120 is in operation, the current signals received from the sensing element 82 (for example, one heartbeat generates one current signal to transmit to the sensing element 82 which is in contact with the skin through the skin surface) enter the electrical connection structure 100 through the conductive textile layer 32 which is connected to the sensing element 82 and serves as the circuit. Then the current signals are transmitted to one end of the signal processing module 80 through the conductive part 52, and the signal processing module 80 stores and records the changes of the voltage drop to further transmit the information to the processor for analysis.

Figure 3:
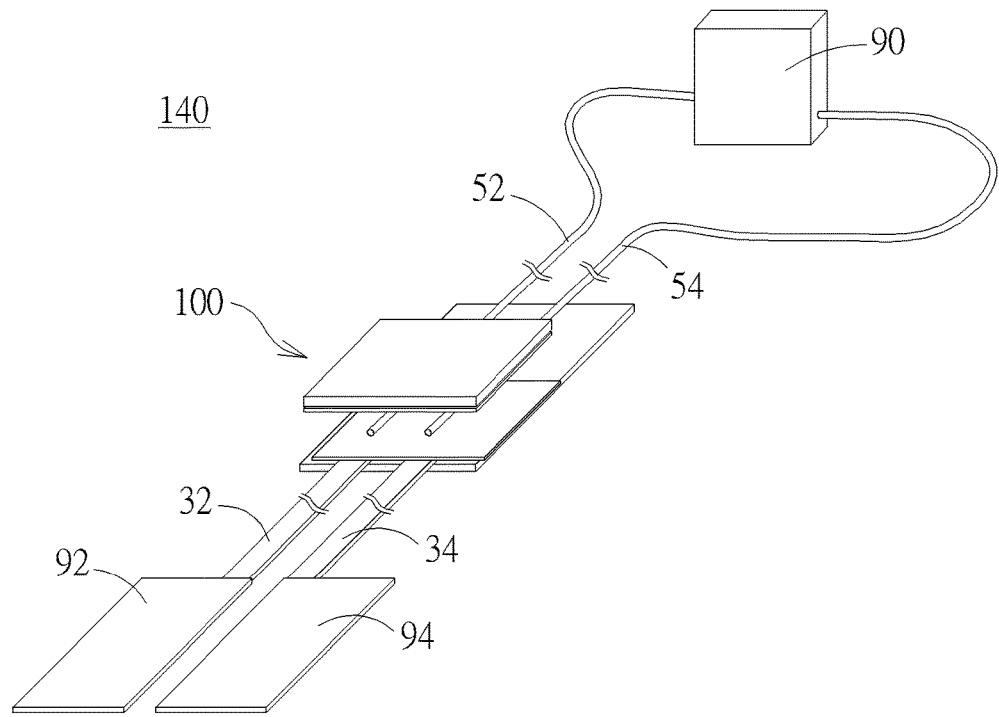
FIG. 3 is a schematic perspective view of an embodiment of the transcutaneous electrical nerve stimulation device of the present invention.

The electrical connection structure 100 of the present invention may also be applicable to a transcutaneous electrical nerve stimulation device. Please refer to FIG. 3. FIG. 3 is a schematic perspective view of an embodiment of the transcutaneous electrical nerve stimulation (henceforth referred to as TENS) device 140. The TENS device 140 of the present invention includes an electrical connection structure 100, a plurality of electric conductive pads 92, 94, and a power supply module 90.

The above-mentioned electric conductive pads 92, 94 respectively correspond to and are directly electrically connected to the conductive textile layers 32, 34 in the electrical connection structure 100. In addition, the positive terminal as well as the negative terminal of the above-mentioned power supply module 90 respectively correspond to and are directly electrically connected to the conductive parts 52,54 in the electrical connection structure 100.

In the TENS device 140 of the present invention, a plurality of conductive textile layers 32, 34 serve as the circuits for the electrical connection.

The above-mentioned conductive pads 92, 94 are not particularly limited, and any conventional or unknown conductive pads maybe applicable to the present invention. For example, the materials and manufacturing methods of the conductive pad 92 may be substantially the same as those of the conductive textile layer 32, so the conductive pad 92 and the conductive textile layer 32 may accordingly be prepared and completed at the same time. Therefore, in this embodiment, one extension end of the conductive pad 92 serves as the conductive textile layer 32 to be arranged within the electrical connection structure 100.

The above-mentioned power supply module 90 may further include a control element to control the intensity of the output current and the output frequency.

When the TENS device 140 of the present invention is in operation, the current signals emitted from the power supply module enter the electrical connection structure 100 through the conductive part 54. The current signals are further transmitted to the conductive pad 94 through the conductive textile layer 34 which serves as the circuit for the electrical connection. At last, the current signals are transmitted to the skin surface which is indirect contact with the conductive pad 94 to have an electrical stimulation effect. The TENS device 140 may be simultaneously connected to and equipped with a plurality of conductive pads by the electrical connection structure 100 of the present invention to provide different parts of a body with therapeutic treatments of electrical stimulation. Accordingly, the number of the conductive pads and the number of the conductive textile layers and conductive parts in the electrical connection structure 100 are not particularly limited, and may be optionally arranged to meet demands.

The following examples are provided to more elaborate the methods of the present invention in details. However, the examples are considered in all respects only as illustrative and not restrictive to limit the present invention. The scope of the present invention is therefore indicated by the appended claims.

Chemicals and Instruments

The chemicals and instruments used in the examples of the present invention are as follows:
1. Polyurethane: Yamaken, CD-5030, solid content 30 wt %, n-Butyl acetate (nBAC) as solvent.
2. Carbon nanotubes: Emaxwin tech multi-walled carbon nanotube-01, multi-walled carbon nanotube-01.
3. Screen: ChiLong Tetoron, Tetoron.
4. Hot melt adhesive film: Bemis, 3415, thermoplastic polyurethane resin, film thickness 75 μm (excluding the thickness of the release paper).
5. Anisotropic conductive adhesive film A: U-PAK, UP3126T, total thickness 85 μm including the thickness of a release paper of 50 μm.
6. Anisotropic conductive adhesive film B: U-PAK, UP3171, total thickness 105 μm including the thickness of a release paper of 75 μm.
7. Anisotropic conductive adhesive film C: U-PAK, UP3094, total thickness 66 μm including the thickness of a release paper of 50 μm.
8. Anisotropic conductive adhesive film D: U-PAK, UP3015, total thickness 68 μm including the thickness of a release paper thickness 50 μm.
9. Anisotropic conductive adhesive film E: U-PAK, UP3011K, total thickness 71 μm including the thickness of a release paper thickness 50 μm.
10. Hot presser: Jiin Yang HA-860A, HA-860A.
11. Copper wire: Dongguan Yuesen Metal, diameter 0.5 mm.
12. Stainless steel wire: Shenzhen Xinyue Metal, diameter 0.7 mm.
13. Dispenser: Ever Sharp technology, EH1500, heat stabilizer dispenser.
14. Epoxy resin: Nagase ChemteX, EX-614B.
15. Flat needles: (Ganbow technology), F8614T, flat stainless steel needles.
16. Protective layer: Bemis, TL644, double-layer polyurethane resin film with total thickness 100 μm.
17. Silver paste: Tatsuta, SW180.
18. Multimeter: HILA, DM2630.
19. Plain weaving fabrics: Everest Textile Co., Ltd., 30 denier plain weaving fabrics.
20. Elbow guard textile: 1-Ming Sanitary Materials, ES-201.
21. Physiological signal recorder: Leadtek, TD3.

Preparation of Conductive Textile Layers

Carbon nanotubes were added to polyurethane resin with a weight ratio of 1:5 (carbon nanotubes:polyurethane resin) and were uniformly mixed to prepare a conductive coating solution. The conductive coating solution was printed on a plain weaving fabric with a 200 mesh screen by screen-printing. Followed by the application of hot air drying at 150° C. to remove the solvent, a conductive coating layer which was embedded in the plain weaving fabric was formed to obtain the conductive textile layer with a total thickness of 80 μm.

EXAMPLE 1

The preparation of the electrical connection structure includes the following steps:

1. A hot melt adhesive film of 2.5 cm×15 cm was used as a substrate. A prepared first conductive textile layer (0.5 cm×5 cm) and another prepared second conductive textile layer (0.5 cm×5 cm) were arranged at parallel intervals of 0.5 cm between them on the hot melt adhesive film (the side away from the release paper). The preheating is carried out at a temperature of 100° C. for about 5 seconds to fix the hot melt adhesive film and the conductive textile layers. Each contact area of the conductive textile layer and the hot melt adhesive film is 0.5 cm×1.5 cm, and each conductive textile layer has an area of 0.5 cm×3.5 cm which is not in contact with the hot melt adhesive film.
2. An anisotropic conductive adhesive film A of 2.5 cm×1.5 cm was taken to be adhered to the first conductive textile layer and to the second conductive textile layer at the same time. Then, pre-pressing was carried out at a temperature of 80° C. and under a pressure of 3 kg/cm$^2$ with a hot presser for 2 seconds. Next, the release paper was peeled off to expose the side which was not attached to the conductive textile layer to the atmosphere to obtain an electrical connection layer.
3. Two copper wires of a diameter of 0.7 mm which respectively corresponded to the first conductive textile layer and to the second conductive textile layer were placed on the conductive adhesive in Step 2. Approximately 1 cm in length of one end of the copper wire was in contact with the conductive adhesive while the other end was exposed to the atmosphere, not fixed, and not in contact with the conductive textile layer.
4. Then another anisotropic conductive adhesive film A of 2.5 cm×1.5 cm was taken to cover the two copper wires, and pre-pressing was carried out at a temperature of 80° C. and under a pressure of 3 kg/cm$^2$ with a hot presser for about 2 seconds. The release paper was then peeled off to expose the side which was not attached to the copper wires to the atmosphere as an adhesive layer.
5. The conductive adhesive in Step 4 was covered with a protective layer of 2.5 cm×1.5 cm. A hot presser was used to carry out a hot pressing at a temperature of 120° C. and under a pressure of 3 kg/cm$^2$ for 60 seconds to make the anisotropic conductive adhesive film fixed. Finally, an electrical connection structure was resultantly obtained.
6. The second conductive textile layer and the first copper wire (the end which was exposed to the atmosphere) corresponding to the first conductive textile layer were connected with a multimeter to measure the resistance value $R_2$. The distance between the two measuring points was 12 cm. If the resistance value $R_2$ is greater than 2,000Ω, it can be determined that the first copper wire and the second conductive textile layer are not electrically connected.

Laundering Test

The well prepared electrical connection structures were subjected to a laundering test according to AATCC 135 test method. After being subjected to the test every 5 times, the first conductive textile layer and the first copper wire (the end which was exposed to the atmosphere) were connected with a multimeter to measure the resistance value $R_1$ with the measuring points 12 cm apart. If the resistance $R_1$ after the laundering is not greater than 2,000Ω, the laundering was repeated 25 times. If the resistance value $R_1$ is greater than 2,000Ω, it was determined that there was no electrical connection (i.e. the electrical connection structure didn't work well). The laundering procedure was stopped and the number of laundering times was collected (NG means electrical disconnection of the structure was observed after first 5 times of laundering). The test results of Example 1 are listed in Table 1 in details.

TABLE 1

| | Laundering test (times) | $R_1$ before laundering test (Ω) | $R_1$ after 25 times laundering (Ω) | resistance value $R_2$ (Ω) |
|---|---|---|---|---|
| Example 1 | 25 | 434 | 446 | >2,000 |

Please refer to Example 1. Before the laundering test, the first conductive textile layer and the first copper wire were connected with a multimeter to measure the resistance value $R_1$ to be 434Ω. It shows that the electrical connection layer provides electrical connection between the first conductive textile layer and the first copper wire, that is, the first conductive textile layer and the first copper wire were electrically connected through the electrical connection layer. After being subjected to laundering 25 times, the resistance $R_1$ was 446Ω to show that the electrical connection maintained well without significant changes. It indicates that this electrical connection structure is not damaged or the electrical connection is not destroyed even after repeated laundering processes for many times. This electrical connection structure has good washability.

The second conductive textile layer and the first copper wire corresponding to the first conductive textile layer were connected with a multimeter to obtain the resistance value $R_2$ greater than 2,000Ω to show that there was no electrical connection between the first copper wire and the second conductive textile layer, and the electrical connection layer did not provide the electrical connection between the two. It also showed that the first conductive textile layer and the second conductive textile layer were not electrically connected through the electrical connection layer so there was no short circuit in the electrical connection structure of Example 1.

EXAMPLE 2

The preparation of Example 2 was the same as that of Example 1 except that Step 4 and Step 5 were altered as follows:

4. A flat needle used for dispensing was filled with 5 g of epoxy resin, and a dispenser was used to coat two copper wires with a coating thickness of 35 μm. Afterwards, the epoxy resin was heated to a temperature of 120° C. for 2 minutes to be cured.
5. The epoxy resin of step 4 was covered with a protective layer of 2.5 cm×1.5 cm and heated by a hot presser at a temperature of 120° C. and under a pressure of 3 kg/cm$^2$ for 60 seconds to obtain another electrical connection structure.

COMPARATIVE EXAMPLE 1

The preparation of Comparative Example 1 was the same as that of Example 1 except that Step 2 was omitted and two copper wires of a diameter of 0.7 mm were directly placed on the first conductive textile layer and on the second conductive textile layer respectively.

COMPARATIVE EXAMPLE 2

The preparation of an electrical connection structure includes the following steps:
1. A hot melt adhesive film of 2.5 cm×15 cm was taken as a substrate. A prepared first conductive textile layer (0.5 cm×1.5 cm) and another prepared second conductive textile layer (0.5 cm×1.5 cm) were arranged at parallel intervals of 0.5 cm between them on the hot melt adhesive film (the side away from the release paper). The preheating was carried out at a temperature of 100° C. for about 5 seconds to fix the hot melt adhesive film and the conductive textile layers.
2. Two copper wires of a diameter of 0.7 mm respectively corresponding to the first conductive textile layer and to the second conductive textile layer were placed on the first conductive textile layer and on the second conductive textile layer. Approximately 1 cm in length of one end of the copper wire was in contact with the conductive textile layer while the other end was exposed to the atmosphere.
3. The two copper wires were at the same time covered with a protective layer of 2.5 cm×1.5 cm and heated by a hot presser at a temperature of 120° C. and under a pressure of 3 kg/cm² for 60 seconds to obtain another electrical connection structure.
4. The second conductive textile layer and the first copper wire (the end which was exposed to the atmosphere) corresponding to the first conductive textile layer were connected with a multimeter with the measuring points 12 cm apart to measure the resistance value $R_2$ greater than 2,000Ω.

COMPARATIVE EXAMPLE 3

The preparation of COMPARATIVE EXAMPLE 3 was the same as that of Example 1 except that Step 4 was omitted and a protective layer directly covered the two copper wires to be heated by a hot presser at a temperature of 120° C. and under a pressure of 3 kg/cm² for 60 seconds to obtain another electrical connection structure.

COMPARATIVE EXAMPLE 4

The preparation of the electrical connection structure includes the following steps:
1. A hot melt adhesive film of 2.5 cm×15 cm was taken as a substrate. A prepared first conductive textile layer (0.5 cm×5 cm) and another prepared second conductive textile layer (0.5 cm×5 cm) were arranged at parallel intervals of 0.5 cm between them on the hot melt adhesive film (the side away from the release paper). The preheating was carried out at a temperature of 100° C. for about 5 seconds to fix the hot melt adhesive film and the conductive textile layers. Each contact area of the conductive textile layer and the hot melt adhesive film was 0.5 cm×1.5 cm, and each conductive textile layer had an area of 0.5 cm×3.5 cm which was not in contact with the hot melt adhesive film.
2. A flat needle used for dispensing was filled with 5 g silver paste, and a dispenser was used to coat the silver paste on the first conductive textile layer and the second conductive textile layer with a controlled coating thickness of 35 μm and a coating area of approximately 2.5 cm×1.5 cm to obtain another electrical connection layer.
3. Two copper wires of a diameter of 0.7 mm respectively corresponding to the first conductive textile layer and to the second conductive textile layer were placed on the silver paste in Step 2. Approximately 1 cm in length of one end of the copper wire was in contact with the silver paste while the other end was exposed to the atmosphere, not fixed, and not in contact with the conductive textile layer.
4. The dispenser was used again to coat the silver paste on the first conductive textile layer and on the second conductive textile layer with a controlled coating thickness of 35 μm and a coating area of approximately 2.5 cm×1.5 cm. Later it was heated to a temperature of 120° C. for 20 minutes to be dried off to serve as an adhesive layer.
5. The silver paste in Step 4 was covered with a protective layer of 2.5 cm×1.5 cm and heated by a hot presser at a temperature of 120° C. and under a pressure of 3 kg/cm² for 60 seconds to obtain another electrical connection structure.
6. The second conductive textile layer and the first copper wire (the end which was exposed to the atmosphere) corresponding to the first conductive textile layer were connected with a multimeter to obtain the resistance value $R_2$ to be 412 C2 with the measuring points 12 cm apart.

TABLE 2

|  | Laundering test (times) |
| --- | --- |
| Example 1 | 25 |
| Example 2 | 25 |
| Comparative Example 1 | NG |
| Comparative Example 2 | NG |
| Comparative Example 3 | 10 |
| Comparative Example 4 | NG |

Please refer to Example 2. An electrical connection structure with epoxy resin as an adhesive layer could be washed up to 25 times and still maintained good electrical conductivity. The electrical connection structure meets the market demands for washability when applied to the wearable smart device.

There was no electrical connection layer disposed in the structure of Comparative Example 1. Although both the copper wires and the conductive textile layers were the medium which allowed the electric current to pass, there is few contact areas disposed between the copper wires and the conductive textile layers because the selected copper wires were in the form of a cylindrical shape. Further, the connection between the copper wires and the conductive textile layers was possibly prone to come off or misalign to make electric signals unstable or even electric disconnected when the conductive textile layers were subjected to being pulled, bent or laundered. The structure in Comparative Example 1 still did not pass the laundering test even it was equipped with an adhesive layer to fix the copper wires to enhance the structural strength. The resistance value $R_1$ exceeded 2,000Ω after 5 times of laundering tests and failed to meet the requirements of washability. In addition to the above mentioned problems in Comparative Example 1 such as unstable electric signals, the structural strength of the structure in Comparative Example 2 without an electrical connection layer and an adhesive layer was even weaker than that of the electrical connection structure in Comparative Example 1. The resistance value $R_1$ was too large to be electrically connected after 5 times of laundering and to be further applied to the wearable smart device.

The structure in Comparative Example 3 with an electrical connection layer has better cladding with the copper wires to improve the above mentioned problem of unstable electrical current signals. However, owing to the absence of an adhesion layer to fix and to enhance the adhesive strength between the copper wires and the electrical connection layer, the resistance value $R_1$ exceeded 2,000Ω when laundering procedures are repeated over 10 times so it failed to meet the market demands for washability of the wearable smart device.

Please refer to Comparative Example 4. By using the silver paste as the electrical connection layer and the adhesive layer, the resistance value $R_2$ before the laundering test was 412Ω to indicate that the first copper wire and the second conductive textile layer were electrically connected through the electrical connection layer made of silver paste. If it is applied to a sensing device of ECG or EMG, a short circuit condition may occur, and a correct voltage difference cannot be correctly detected, which means that the electrical signals cannot be detected. In addition, this electrical connection structure was not strong enough to be washed, either. The resistance value $R_1$ exceeded 2,000Ω after 5 times of laundering procedures, and it failed to be well electric conductive.

EXAMPLE 3

The preparation of Example 3 is the same as that of Example 1, except that the anisotropic conductive adhesive film A in Step 2 and in Step 4 was replaced with the anisotropic conductive adhesive film B, and the thickness of the conductive adhesive was 30 μm (excluding the release paper). Therefore, the total thickness of the electrical connection layer and the adhesive layer was 60 μm. The results of the laundering test are listed in Table 3.

COMPARATIVE EXAMPLEs 5-7

The preparation of Comparative Examples 5 to 7 was the same as that of Example 1, except that the anisotropic conductive adhesive film A in Step 2 and in Step 4 was respectively replaced with the anisotropic conductive adhesive films C, D, and E, and the thickness of the conductive adhesives was 16 μm, 18 μm, and 21 μm, respectively (excluding the release paper). Therefore, the total thickness of the electrical connection layer and the adhesive layer was 32 μm, 36 μm, and 42 μm, respectively. The results of the laundering test are listed in Table 3.

COMPARATIVE EXAMPLE 8

The preparation of Comparative Example 8 was the same as that of Example 3, except that the anisotropic conductive adhesive film B in Step 4 was replaced with the anisotropic conductive adhesive film E, and the thickness of the conductive adhesive was 21 μm (excluding the release paper). Therefore, the total thickness of the electrical connection layer and the adhesive layer was 51 μm. The results of the laundering test are listed in Table 3.

TABLE 3

| | Total Thickness of Electrical Connection Layer and Adhesive Layer (μm) | Laundering Test (times) |
|---|---|---|
| Example 1 | 70 | 25 |
| Example 2 | 70 | 25 |
| Example 3 | 60 | 25 |
| Comparative Example 5 | 32 | 15 |

TABLE 3-continued

| | Total Thickness of Electrical Connection Layer and Adhesive Layer (μm) | Laundering Test (times) |
|---|---|---|
| Comparative Example 6 | 36 | 20 |
| Comparative Example 7 | 42 | 20 |
| Comparative Example 8 | 51 | 20 |

According to Table 3, when the total thickness of the electrical connection layer and the adhesive layer was greater than or equal to 60 μm, the electrical connection structure still maintained the electrical conduction function without any damage in appearance even after 25 times of the laundering test. When the total thickness of the electrical connection layer and the adhesive layer was less than 60 μm, it merely could pass up to 20 times of the laundering test, which suggests that the electrical connection layer and the adhesive layer were insufficient in strength to make the copper wires well fixed between the two due to insufficient thickness. The copper wires and the electrical connection layer have already come loose after laundering so it was not possible to make the electrical current stably pass through the electrical connection layer.

EXAMPLE 4

The preparation of Example 4 was the same as that of Example 1, except that the copper wires of a diameter of 0.7 mm in Step 3 were replaced with copper wires of a diameter of 0.5 mm. The sum of a first contact area between one of the copper wires and the electrical connection layer and a second contact area between one of the copper wires and the adhesive layer was 15.7 mm². The results of the laundering test are listed in Table 4.

Sum of the contact area (mm²)=π×0.5×10=15.7

EXAMPLE 5

The preparation of Example 5 was the same as that of Example 1, except that the copper wires of a diameter of 0.7 mm in Step 3 were replaced with copper wires of a diameter of 0.9 mm. The sum of a first contact area between one of the copper wires and the electrical connection layer and a second contact area between one of the copper wires and the adhesive layer was 28.3 mm². The results of the laundering test are listed in Table 4.

EXAMPLE 6

The preparation of Example 6 was the same as that of Example 1, except that the copper wires of a diameter of 0.7 mm in Step 3 were replaced with copper wires of a diameter of 0.5 mm, and approximately 1.5 cm in length of one end of the copper wire was in contact with the conductive adhesive while the other end was exposed to the atmosphere and not fixed. The sum of a first contact area between one of the copper wires and the electrical connection layer and a second contact area between one of the copper wires and the adhesive layer was 23.6 mm². The results of the laundering test are listed in Table 4.

EXAMPLE 7

The preparation of Example 7 was the same as that of Example 1, except that approximately 1.5 cm in length of one end of the copper wire was in contact with the conductive adhesive while the other end was exposed to the atmosphere and not fixed. The sum of a first contact area between one of the copper wires and the electrical connection layer and a second contact area between one of the copper wires and the adhesive layer was 33.0 mm². The results of the laundering test are listed in Table 4.

EXAMPLE 8

The preparation of Example 8 was the same as that of Example 1, except that the copper wires of a diameter of 0.7 mm in Step 3 were replaced with copper wires of a diameter of 0.9 mm, and approximately 1.5 cm in length of one end of the copper wire was in contact with the conductive adhesive while the other end was exposed to the atmosphere and not fixed. The sum of a first contact area between one of the copper wires and the electrical connection layer and a second contact area between one of the copper wires and the adhesive layer was 42.4 mm². The results of the laundering test are listed in Table 4.

EXAMPLE 9

The preparation of Example 9 was the same as that of Example 1, except that the copper wires of a diameter of 0.7 mm in Step 3 were replaced with stainless steel wires of a diameter of 0.7 mm. The sum of a first contact area between one of the stainless steel wires and the electrical connection layer and a second contact area between one of the stainless steel wires and the adhesive layer was 22.0 mm². The washability was up to 25 times, while the resistance $R_1$ before laundering was 518Ω, and the resistance $R_1$ after being subjected to laundering of 25 times was 531Ω. The results of the laundering test are listed in Table 4.

COMPARATIVE EXAMPLE 9

The preparation of Comparative Example 9 was the same as that of Example 1, except that the copper wires of a diameter of 0.7 mm in Step 3 were replaced with copper wires of a diameter of 0.3 mm, and approximately 0.5 cm in length of one end of the copper wire was in contact with the conductive adhesive while the other end was exposed to the atmosphere and not fixed. The sum of a first contact area between one of the copper wires and the electrical connection layer and a second contact area between one of the copper wires and the adhesive layer was 4.7 mm². The results of the laundering test are listed in Table 4.

COMPARATIVE EXAMPLE 10

The preparation of Comparative Example 10 was the same as that of Example 1, except that the copper wires of a diameter of 0.7 mm in Step 3 were replaced with copper wires of a diameter of 0.3 mm. The sum of a first contact area between one of the copper wires and the electrical connection layer and a second contact area between one of the copper wires and the adhesive layer was 9.4 mm². The results of the laundering test are listed in Table 4.

COMPARATIVE EXAMPLE 11

The preparation of Comparative Example 11 was the same as that of Example 1, except that the copper wires of a diameter of 0.7 mm in Step 3 were replaced with copper wires of a diameter of 0.3 mm, and approximately 1.5 cm in length of one end of the copper wire was in contact with the conductive adhesive while the other end was exposed to the atmosphere and not fixed. The sum of a first contact area between one of the copper wires and the electrical connection layer and a second contact area between one of the copper wires and the adhesive layer was 14.1 mm². The results of the laundering test are listed in Table 4.

COMPARATIVE EXAMPLE 12

The preparation of Comparative Example 12 was the same as that of Example 1, except that the copper wires of a diameter of 0.7 mm in Step 3 were replaced with copper wires of a diameter of 0.5 mm, and approximately 0.5 cm in length of one end of the copper wire was in contact with the conductive adhesive while the other end was exposed to the atmosphere and not fixed. The sum of a first contact area between one of the copper wires and the electrical connection layer and a second contact area between one of the copper wires and the adhesive layer was 7.9 mm². The results of the laundering test are listed in Table 4.

COMPARATIVE EXAMPLE 13

The preparation of Comparative Example 13 was the same as that of Example 1, except that approximately 0.5 cm in length of one end of the copper wire in Step 3 was in contact with the conductive adhesive while the other end was exposed to the atmosphere and not fixed. The sum of a first contact area between one of the copper wires and the electrical connection layer and a second contact area between one of the copper wires and the adhesive layer was 11.0 mm². The results of the laundering test are listed in Table 4.

COMPARATIVE EXAMPLE 14

The preparation of Comparative Example 14 was the same as that of Example 1, except that the copper wires of a diameter of 0.7 mm in Step 3 were replaced with copper wires of a diameter of 0.9 mm, and approximately 0.5 cm in length of one end of the copper wire was in contact with the conductive adhesive while the other end was exposed to the atmosphere and not fixed. The sum of a first contact area between one of the copper wires and the electrical connection layer and a second contact area between one of the copper wires and the adhesive layer was 14.1 mm². The results of the laundering test are listed in Table 4.

TABLE 4

|  | Wire Diameter (mm) | Sum of Contact Areas (mm²) | Laundering Test (times) |
| --- | --- | --- | --- |
| Example 1 | 0.7 | 22.0 | 25 |
| Example 4 | 0.5 | 15.7 | 25 |
| Example 5 | 0.9 | 28.3 | 25 |
| Example 6 | 0.5 | 23.6 | 25 |
| Example 7 | 0.7 | 33.0 | 25 |
| Example 8 | 0.9 | 42.4 | 25 |
| Example 9 | 0.7 | 22.0 | 25 |
| Comparative Example 9 | 0.3 | 4.7 | 10 |
| Comparative Example 10 | 0.3 | 9.4 | 15 |
| Comparative Example 11 | 0.3 | 14.1 | 20 |
| Comparative Example 12 | 0.5 | 7.9 | 10 |

TABLE 4-continued

| | Wire Diameter (mm) | Sum of Contact Areas (mm$^2$) | Laundering Test (times) |
|---|---|---|---|
| Comparative Example 13 | 0.7 | 11.0 | 15 |
| Comparative Example 14 | 0.9 | 14.1 | 20 |

As can be observed from Table 4, the greater the sum of the first contact area between one of the copper wires and the electrical connection layer and the second contact area between one of the copper wires and the adhesive layer is, the better the cladding effect is to cover the copper wires by the electrical connection layer and the adhesive layer. The copper wires were much less likely to come loose, and the washability can also be enhanced accordingly.

Therefore, when the sum of the first contact area between one of the copper wires and the electrical connection layer and the second contact area between one of the copper wires and the adhesive layer is equal to or greater than 15.7 mm$^2$, the electrical connection structure may have better laundering performance.

Referring to Comparative Examples 9 to 14, the electrical connection structure with the sum of the first contact area between one of the copper wires and the electrical connection layer and the second contact area between one of the copper wires and the adhesive layer less than 15.7 mm$^2$ can pass only up to 20 times of the laundering procedures at most and failed to meet the market demands for washability.

The Preparation of Myoelectric Sensor Device

The preparation of a myoelectric sensor device includes the following steps:

1. A hot melt adhesive film (3 cm×1.5 cm) was applied on an elbow guard textile, and a first conductive textile layer (0.5 cm×2 cm), a second conductive textile layer (0.5 cm×2 cm) and a third conductive textile layer (0.5 cm×2 cm) were arranged at parallel intervals of 0.5 cm between them on the hot melt adhesive film after the release paper had been peeled off. The preheating was conducted at a temperature of 100° C. for about 5 seconds to fix the hot melt adhesive film and the conductive textile layers on the elbow guard textile. Approximately 1 cm in length of each conductive textile layer was not fixed to the elbow guard textile and the unfixed part of the conductive textile layers served as sensor elements.
2. An anisotropic conductive adhesive film A of 3 cm×1.5 cm was taken to be adhered to the first conductive textile layer, to the second conductive textile layer and to the third conductive textile layer at the same time. Later, pre-pressing was carried out by a hot presser at a temperature of 80° C. and under a pressure of 3 kg/cm$^2$ for 2 seconds, then the release paper was peeled off to expose one side which was not attached to the conductive textile layers to the atmosphere to obtain an electrical connection layer.
3. The positive wire, the negative wire and a reference wire of a physiological signal recorder which respectively corresponded to the first conductive textile layer, the second conductive textile layer and the third conductive textile layer were placed on the conductive adhesive in Step 2. Approximately 1 cm in length of one end of the wires was in contact with the conductive adhesive, and the wires were not in contact with the conductive textile layers.
4. Another anisotropic conductive adhesive film A of 3 cm×1.5 cm was taken to cover the three wires at the same time and pre-pressing was carried out by a hot presser at a temperature of 80° C. and under a pressure of 3 kg/cm$^2$ for 2 seconds, then the release paper was peeled off to expose one side which was not attached to the wires to the atmosphere to serve as an adhesive layer.
5. The conductive adhesive of Step 4 was covered with a protective layer of 3 cm×1.5 cm and the hot-pressing was carried out by a hot presser at a temperature of 120° C. and under a pressure of 3 kg/cm$^2$ for 60 seconds to fix the anisotropic conductive adhesive films. At last, a myoelectric sensor device was obtained.
6. The myoelectric sensor device was worn and the electric current signals collected by a first sensing element (the unfixed part of the first conductive textile layer) and by a second sensing element (the unfixed part of the second conductive textile layer) were recorded by a physiological signal recorder. Then, the signals were transmitted to a processor by the Bluetooth function which was built in the physiological signal recorder to analyze. The background noises detected by a third sensing element (the unfixed part of the third conductive textile layer) were filtered out to obtain a more accurate Electromyography (EMG).

In this preparation example of a myoelectric sensor device, the materials and the manufacturing procedures of the conductive textile layers and the sensing elements were the same. Therefore, the unfixed part of a conductive textile layer served as a sensing element saves the processing cost of separately preparing the sensing elements and joining the sensing elements.

When a sensor device is manufactured in a conventional way, the wires of a physiological signal recorder need to be fixed separately, in other words, an anisotropic conductive adhesive film, a wire, another anisotropic conductive adhesive film and a protective layer need to be sequentially and separately arranged, and the above steps are repeatedly carried out in accordance with the number of the wires to make the manufacturing process relatively step-consuming. The myoelectric sensor device provided by the present invention may omit the complicated steps of the conventional manufacturing process to complete the fixation of a plurality of wires at one time, and maintain good electric conductive function so a short circuit or an open circuit is less likely to occur.

Furthermore, the electrical connection structure whose wires are dismantled from the physiological signal recorder can be laundered together with the textile, and the electrical connection structure after being laundered still maintains good electric conductive function to solve the problem that a conventional wearable smart device cannot be laundered.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrical connection structure, comprising:
   a substrate;
   a plurality of conductive textile layers separately disposed apart from each other on the substrate;
   an electrical connection layer disposed on the conductive textile layers;
   a plurality of conductive parts disposed on the electrical connection layer and respectively disposed to correspond to the conductive textile layers;
   an adhesive layer disposed on the conductive parts; and a protective layer disposed on the adhesive layer, wherein the electrical connection layer provides an electrical connection between the conductive textile layers and the conductive parts which correspond to the conductive textile layers, and the conductive textile layers which are separately disposed apart from each other are not electrically connected directly, and at least a sum of a first contact area between one of the conductive parts and the electrical connection layer and a second contact area between one of the conductive parts and the adhesive layer is not less than 15.7 $mm^2$.

2. The electrical connection structure of claim 1, wherein the conductive parts are substantially not in direct contact with the conductive textile layers.

3. The electrical connection structure of claim 1, wherein a sum of a thickness of the electrical connection layer and a thickness of the adhesive layer is between 60 μm and 300 μm.

4. The electrical connection structure of claim 1, wherein a sum of a thickness of the electrical connection layer and a thickness of the adhesive layer is between 70 μm and 300 μm.

5. The electrical connection structure of claim 1, wherein the electrical connection layer is composed of an anisotropic conductive adhesive.

6. The electrical connection structure of claim 5, wherein the anisotropic conductive adhesive comprises a thermosetting resin and a conductive particle.

7. The electrical connection structure of claim 6, wherein the thermosetting resin is an epoxy resin, a melamine formaldehyde resin, a polybutadiene resin, an organic silicone resin or any combination thereof.

8. The electrical connection structure of claim 6, wherein the conductive particle is a metal particle, an alloy particle, a metal-coated polymer resin particle, or any combination thereof.

9. The electrical connection structure of claim 6, wherein the conductive particle has a particle size distribution in a range of 4 μm to 10 μm.

10. The electrical connection structure of claim 1, wherein the conductive parts are electric conductive wires or electric conductive sheets.

11. The electrical connection structure of claim 10, wherein the electric conductive wires are metal wires.

12. The electrical connection structure of claim 1, wherein a material of the adhesive layer is a thermosetting resin or a photocurable resin.

13. The electrical connection structure of claim 12, wherein the thermosetting resin is an epoxy resin, a melamine formaldehyde resin, a polybutadiene resin, an organic silicone resin or any combination thereof.

14. The electrical connection structure of claim 12, wherein the photocurable resin is an acrylic resin, a polyurethane acrylate or any combination thereof.

15. The electrical connection structure of claim 1, wherein a material of the protective layer is a polyurethane resin, a thermoplastic polyurethane resin, polyethylene, polyethylene terephthalate or any combination thereof.

16. The electrical connection structure of claim 1, wherein one of the conductive textile layers comprise:
  a textile substrate; and
  a conductive coating layer comprising a hydrophobic binder and a plurality of conductive particles distributed therein, wherein the conductive coating layer is embedded in the textile substrate from one side of the textile substrate and leveled with the textile substrate, and a thickness of the conductive coating layer is not greater than that of the textile substrate.

* * * * *